(12) United States Patent
Mine et al.

(10) Patent No.: US 10,991,608 B2
(45) Date of Patent: Apr. 27, 2021

(54) SUBSTRATE COATING APPARATUS FOR FLOATING SUBSTRATE AND METHOD

(71) Applicant: Tokyo Electron Limited, Tokyo (JP)

(72) Inventors: Yousuke Mine, Kumamoto (JP); Kazuhito Miyazaki, Kumamoto (JP)

(73) Assignee: TOKYO ELECTRON LIMITED, Tokyo (JP)

(*) Notice: Subject to any disclaimer, the term of this patent is extended or adjusted under 35 U.S.C. 154(b) by 7 days.

(21) Appl. No.: 15/889,276

(22) Filed: Feb. 6, 2018

(65) Prior Publication Data
US 2018/0233707 A1 Aug. 16, 2018

(30) Foreign Application Priority Data

Feb. 10, 2017 (JP) .............................. JP2017-023282

(51) Int. Cl.
*H01L 21/677* (2006.01)
*B05C 13/02* (2006.01)
(Continued)

(52) U.S. Cl.
CPC ........ *H01L 21/67787* (2013.01); *B05C 13/02* (2013.01); *F16C 29/008* (2013.01); *H01L 21/67173* (2013.01); *H01L 21/67784* (2013.01); *B05C 5/0291* (2013.01); *B25B 11/00* (2013.01); *B41J 2/01* (2013.01); *B65G 47/24* (2013.01); *G03F 7/70816* (2013.01);
(Continued)

(58) Field of Classification Search
CPC ......... H01L 21/67173; H01L 21/67784; F16C 29/008; G03F 7/70816; B25B 11/00

USPC ................................ 269/903, 289 R, 289 MR
See application file for complete search history.

(56) References Cited

U.S. PATENT DOCUMENTS 4,547,024 A * 10/1985 Teramachi ............. B23Q 1/621
384/45
4,788,477 A * 11/1988 Teramachi ............ F16C 29/008
318/135

(Continued)

FOREIGN PATENT DOCUMENTS

JP 2004-177262 A 6/2004
JP 2004-214384 A 7/2004
(Continued)

*Primary Examiner* — Karl Kurple
(74) *Attorney, Agent, or Firm* — Abelman, Frayne & Schwab

(57) ABSTRACT

Provided is a coating apparatus including: a stage unit which floats the substrate to a predetermined height by using wind pressure of gas; a droplet discharge unit which drops the droplet of the functional liquid on the substrate floated to the predetermined height from the stage unit; a main scanning direction moving unit which moves the substrate, which is floated to the predetermined height from the stage unit, in the main scanning direction while holding the substrate; and a sub-scanning direction moving unit which moves the droplet discharge unit in the sub-scanning direction with respect to the substrate floated to the predetermined height from the stage unit. The sub-scanning direction moving unit moves the droplet discharge unit in the sub-scanning direction while the main scanning direction moving unit repeatedly moves the substrate in the main scanning direction and the droplet discharge unit repeatedly drops the droplet.

8 Claims, 9 Drawing Sheets

(51) Int. Cl.
*B65G 47/24* (2006.01)
*F16C 29/00* (2006.01)
*H01L 21/67* (2006.01)
*B25B 11/00* (2006.01)
*G03F 7/20* (2006.01)
*H01L 51/56* (2006.01)
*B05C 5/02* (2006.01)
*H01L 51/00* (2006.01)
*B41J 2/01* (2006.01)
*H01L 27/32* (2006.01)

(52) U.S. Cl.
CPC ...... *H01L 27/3244* (2013.01); *H01L 51/0005* (2013.01); *H01L 51/0029* (2013.01); *H01L 51/56* (2013.01)

(56) References Cited

U.S. PATENT DOCUMENTS

| | | | | |
|---|---|---|---|---|
| 6,629,471 | B2* | 10/2003 | Uchimi | F16C 29/025 74/490.09 |
| 6,887,333 | B1* | 5/2005 | Kessler | B65C 3/26 134/72 |
| 7,900,896 | B2* | 3/2011 | Fujita | H01J 37/26 269/58 |
| 7,908,995 | B2* | 3/2011 | Inamasu | B65G 49/067 118/300 |
| 8,517,363 | B2* | 8/2013 | Makino | H01L 21/682 269/73 |
| 8,528,722 | B2* | 9/2013 | Clerkx | B65G 49/064 198/377.1 |
| 8,992,086 | B2* | 3/2015 | Akashi | F16C 29/008 384/9 |
| 9,214,372 | B2* | 12/2015 | Sahoda | H01L 21/67051 |
| 9,836,844 | B2* | 12/2017 | Miyazaki | G05B 19/402 |
| 10,529,610 | B2* | 1/2020 | Liang | B65G 49/065 |
| 10,588,251 | B2* | 3/2020 | Okazaki | H05K 13/0413 |
| 2002/0088393 | A1* | 7/2002 | Kitano | B05C 5/0208 118/305 |
| 2002/0162728 | A1* | 11/2002 | Hirasawa | H01L 21/67736 198/465.1 |
| 2003/0063154 | A1* | 4/2003 | Goto | B41J 2/145 347/40 |
| 2003/0081077 | A1* | 5/2003 | Nakamura | H01L 23/544 347/65 |
| 2003/0113043 | A1* | 6/2003 | Uchimi | G03F 7/70716 384/12 |
| 2003/0169409 | A1* | 9/2003 | Nishi | G03F 7/70716 355/51 |
| 2005/0063791 | A1* | 3/2005 | Chang | B65G 49/065 406/198 |
| 2005/0252395 | A1* | 11/2005 | Sakaue | H05K 3/1216 101/123 |
| 2005/0279281 | A1* | 12/2005 | Yamashita | H01L 21/67126 118/719 |
| 2006/0285945 | A1* | 12/2006 | Hofmeister | H01L 21/67161 414/217 |
| 2007/0183871 | A1* | 8/2007 | Hofmeister | H01L 21/67161 414/332 |
| 2008/0286442 | A1* | 11/2008 | Ushiyama | H01L 51/0005 427/8 |
| 2009/0013927 | A1* | 1/2009 | Yamasaki | B65G 49/065 118/300 |
| 2009/0236789 | A1* | 9/2009 | Jones | B41J 3/543 271/3.14 |
| 2010/0068014 | A1* | 3/2010 | Mitsuyoshi | B65G 49/067 414/225.01 |
| 2010/0194009 | A1* | 8/2010 | Fullwood | G03F 7/2014 269/9 |
| 2010/0243163 | A1* | 9/2010 | Ino | B65G 49/061 156/345.31 |
| 2010/0250004 | A1* | 9/2010 | Makino | G03F 7/70716 700/275 |
| 2010/0309484 | A1* | 12/2010 | Yagi | B65G 49/064 356/614 |
| 2011/0043784 | A1* | 2/2011 | Aoki | G03F 7/707 355/72 |
| 2011/0102762 | A1* | 5/2011 | Ichinose | G03F 7/70991 355/72 |
| 2011/0244120 | A1* | 10/2011 | Choi | H01L 21/67173 427/162 |
| 2011/0262252 | A1* | 10/2011 | Lee | H01L 21/67173 414/222.07 |
| 2012/0057140 | A1* | 3/2012 | Aoki | F16C 29/008 355/53 |
| 2012/0090543 | A1* | 4/2012 | Cheong | C23C 14/34 118/719 |
| 2013/0051957 | A1* | 2/2013 | Lee | H01L 21/67173 414/222.01 |
| 2013/0280825 | A1* | 10/2013 | Yoshitaka | H01L 21/67051 438/14 |
| 2013/0285037 | A1* | 10/2013 | Nishikawa | H01L 51/5212 257/40 |
| 2014/0003891 | A1* | 1/2014 | Kobayashi | H01L 21/67173 414/217 |
| 2014/0047990 | A1* | 2/2014 | Fujii | B41F 15/0881 101/123 |
| 2014/0064643 | A1* | 3/2014 | Akashi | B23Q 1/621 384/49 |
| 2014/0138243 | A1* | 5/2014 | Pethe | C23C 14/185 204/298.11 |
| 2014/0290567 | A1* | 10/2014 | Mauck | H01L 51/56 118/46 |
| 2014/0353505 | A1* | 12/2014 | Sada | G01N 21/8806 250/341.4 |
| 2015/0086303 | A1* | 3/2015 | Nakagawa | H01L 21/67173 414/222.13 |
| 2015/0259786 | A1* | 9/2015 | Ko | H01L 51/5253 118/50.1 |
| 2017/0004983 | A1* | 1/2017 | Madigan | H01L 51/0005 |
| 2017/0062762 | A1* | 3/2017 | Jain | C09D 135/02 |
| 2018/0026234 | A1* | 1/2018 | Jain | C09D 11/101 438/26 |
| 2018/0217201 | A1* | 8/2018 | Endo | H01L 21/68 |
| 2018/0229497 | A1* | 8/2018 | Darrow | B41J 2/2135 |
| 2018/0247840 | A1* | 8/2018 | Liang | H01L 21/67706 |
| 2018/0370263 | A1* | 12/2018 | Mauck | H01L 51/56 |
| 2019/0037739 | A1* | 1/2019 | Okazaki | H05K 13/0812 |

FOREIGN PATENT DOCUMENTS

| | | |
|---|---|---|
| JP | 2008-182002 A | 8/2008 |
| JP | 2009-117571 A | 5/2009 |
| JP | 2009-147240 A | 7/2009 |
| JP | 2010-082488 A | 4/2010 |

* cited by examiner

SUBSTRATE COATING APPARATUS FOR FLOATING SUBSTRATE AND METHOD

CROSS-REFERENCE TO RELATED APPLICATIONS

This application is based on and claims priority from Japanese Patent Application No. 2017-023282, filed on Feb. 10, 2017, with the Japan Patent Office, the disclosure of which is incorporated herein in its entirety by reference.

TECHNICAL FIELD

The present disclosure relates to a coating apparatus and a coating method.

BACKGROUND

In the related art, there has been known an organic light emitting diode (OLED) which is a light emitting diode using light emitted by organic electroluminescence (EL). An organic EL display using the organic light emitting diode has advantages in that the organic EL display is thin and light in weight, in that the organic EL display requires low power consumption, and in that the organic EL display is excellent in terms of a response speed, a viewing angle, and a contrast ratio. For this reason, recently, the organic EL display has attracted attention as a next-generation flat panel display (FPD).

The organic light emitting diode has a positive electrode formed on a substrate, a negative electrode provided opposite to the substrate with respect to the positive electrode, and organic layers provided between the positive electrode and the negative electrode. The organic layers include, for example, a hole injection layer, a hole transport layer, a light emitting layer, an electron transport layer, and an electron injection layer in this order in a direction from the positive electrode to the negative electrode. An inkjet type coating apparatus is used to form the light emitting layer or the like.

A coating apparatus disclosed in Japanese Laid-Open Patent Publication No. 2004-177262 includes a multi-functional droplet discharge head which performs a drawing process on a workpiece by an inkjet method, a workpiece stage on which the workpiece is mounted, and a linear motor which moves the workpiece stage in a main scanning direction. The workpiece stage has a suction table which sucks the workpiece, and a θ table which performs θ correction of the position of the workpiece, which is set on the suction table, in a θ-axis direction.

SUMMARY

An embodiment of the present disclosure provides a coating apparatus which draws a drawing pattern of a functional liquid on a substrate by moving a landing position of a droplet of the functional liquid on the substrate in a main scanning direction and a sub-scanning direction. The coating apparatus includes: a stage unit which floats the substrate to a predetermined height by using wind pressure of gas; a droplet discharge unit which drops the droplet of the functional liquid on the substrate floated to the predetermined height from the stage unit; a main scanning direction moving unit which moves the substrate, which is floated to the predetermined height from the stage unit, in the main scanning direction while holding the substrate; and a sub-scanning direction moving unit which moves the droplet discharge unit in the sub-scanning direction with respect to the substrate floated to the predetermined height from the stage unit. The sub-scanning direction moving unit moves the droplet discharge unit in the sub-scanning direction while the main scanning direction moving unit continues to move the substrate in the main scanning direction and the droplet discharge unit continues to drop the droplet.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
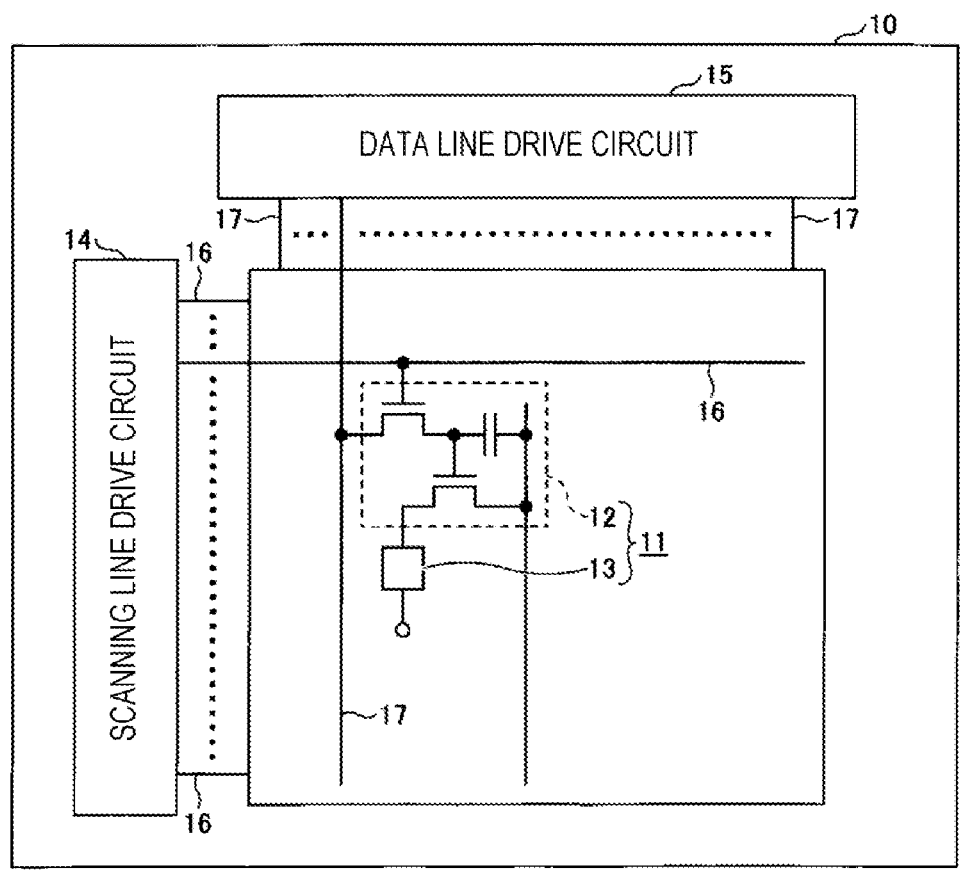
FIG. 1 is a top plan view illustrating an organic EL display according to an exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In the related art, a workpiece stage for holding a substrate is heavy in weight, and as a result, driving power for moving the substrate is high, and there is room for improvement on controllability related to the position of the substrate.

The present disclosure has been made in consideration of the problem, and a main object of the present disclosure is to provide a coating apparatus capable of improving controllability related to the position of a substrate.

An embodiment of the present disclosure provides a coating apparatus which draws a drawing pattern of a functional liquid on a substrate by moving a landing position of a droplet of the functional liquid on the substrate in a main scanning direction and a sub-scanning direction. The coating apparatus includes: a stage unit which floats the substrate to a predetermined height by using wind pressure of gas; a droplet discharge unit which drops the droplet of the functional liquid on the substrate floated to the predetermined height from the stage unit; a main scanning direction moving unit which moves the substrate, which is floated to the predetermined height from the stage unit, in the main scanning direction while holding the substrate; and a sub-scanning direction moving unit which moves the droplet discharge unit in the sub-scanning direction with respect to the substrate floated to the predetermined height from the stage unit. The sub-scanning direction moving unit moves the droplet discharge unit in the sub-scanning direction while the main scanning direction moving unit continues to move the substrate in the main scanning direction and the droplet discharge unit continues to drop the droplet.

According to an aspect of the present disclosure, there is provided a coating apparatus capable of improving controllability related to a position of a substrate.

Hereinafter, an exemplary embodiment of the present disclosure will be described with reference to the drawings. In the respective drawings, the same or corresponding constituent elements are designated by the same or corresponding reference numerals, and a description of thereof will be omitted.

<Organic EL Display>

FIG. 1 is a top plan view illustrating an organic EL display according to an exemplary embodiment. FIG. 1 is an enlarged view of a circuit of a single unit circuit 11.

The organic EL display has a substrate 10, multiple unit circuits 11 which are arranged on the substrate 10, a scanning line drive circuit 14 which is provided on the substrate 10, and a data line drive circuit 15 which is provided on the substrate 10. The unit circuits 11 are provided in regions surrounded by multiple scanning lines 16 connected to the scanning line drive circuit 14 and multiple data lines 17 connected to the data line drive circuit 15. The unit circuit 11 includes a TFT layer 12 and an organic light emitting diode 13.

The TFT layers 12 each has multiple thin film transistors (TFTs). One of the TFTs functions as a switching element, and the other TFTs function as current control elements for controlling amperage of current flowing in the organic light emitting diode 13. The TFT layer 12 is operated by the scanning line drive circuit 14 and the data line drive circuit 15 and supplies current to the organic light emitting diode 13. The TFT layer 12 is provided for each unit circuit 11, and the multiple unit circuits 11 are independently controlled. In addition, the TFT layer 12 may have a general configuration and is not limited to the configuration illustrated in FIG. 1.

A method of operating the organic EL display is an active matrix method in the present exemplary embodiment, but may be a passive matrix method.

Figure 2:
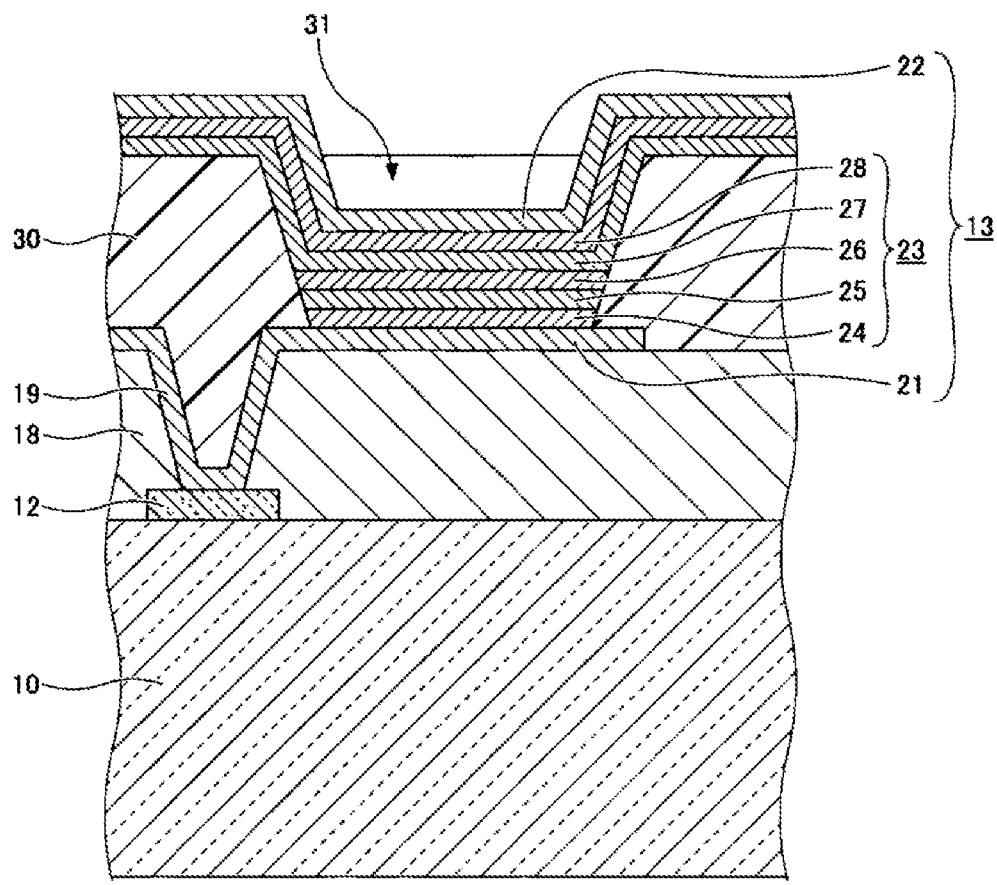
FIG. 2 is a cross-sectional view illustrating a main part of the organic EL display according to the exemplary embodiment.

FIG. 2 is a cross-sectional view illustrating a main part of the organic EL display according to the exemplary embodiment. A transparent substrate such as a glass substrate or a resin substrate is used as the substrate 10. The TFT layer 12 is formed on the substrate 10. A flattening layer 18, which flattens a stepped portion formed by the TFT layer 12, is formed on the TFT layer 12.

The flattening layer 18 has insulation properties. A contact plug 19 is formed in a contact hole that penetrates the flattening layer 18. The contact plug 19 electrically connects the TFT layer 12 to a positive electrode 21 as a pixel electrode formed on a flat surface of the flattening layer 18. The contact plug 19 may be formed simultaneously with the positive electrode 21 using a material identical to a material of the positive electrode 21.

The organic light emitting diode 13 is formed on the flat surface of the flattening layer 18. The organic light emitting diode 13 has the positive electrode 21 which serves as a pixel electrode, a negative electrode 22 which serves as a counter electrode provided opposite to the substrate 10 based on the pixel electrode, and organic layers 23 which are formed between the positive electrode 21 and the negative electrode 22. Voltage is applied between the positive electrode 21 and the negative electrode 22 by operating the TFT layer 12, and as a result, the organic layers 23 emit light.

The positive electrode 21 is formed of, for example, indium tin oxide (ITO) or the like, and transmits the light from the organic layers 23. The light transmitted through the positive electrode 21 is transmitted through the substrate 10 and taken out to the outside. The positive electrode 21 is provided for each unit circuit 11.

The negative electrode 22 is formed of, for example, aluminum and the like, and reflects the light from the organic layers 23 toward the organic layers 23. The light reflected by the negative electrode 22 is transmitted through the organic layers 23, the positive electrode 21, and the substrate 10 and taken out to the outside. The negative electrode 22 is provided in common for the multiple unit circuits 11.

The organic layers 23 include, for example, a hole injection layer 24, a hole transport layer 25, a light emitting layer 26, an electron transport layer 27, and an electron injection layer 28 in this order in the direction from the positive electrode 21 to the negative electrode 22. When voltage is applied between the positive electrode 21 and the negative electrode 22, a hole is injected into the hole injection layer 24 from the positive electrode 21, and an electron is injected into the electron injection layer 28 from the negative electrode 22. The hole injected into the hole injection layer 24 is transported to the light emitting layer 26 by the hole transport layer 25. In addition, the electron injected into the electron injection layer 28 is transported to the light emitting layer 26 by the electron transport layer 27. Therefore, the hole and the electron are combined again in the light emitting layer 26, and a light emitting material of the light emitting layer 26 is excited such that the light emitting layer 26 emits light.

For example, a red light emitting layer, a green light emitting layer, and a blue light emitting layer are formed as the light emitting layer 26. The red light emitting layer is made of a red light emitting material that emits red light, the green light emitting layer is made of a green light emitting material that emits green light, and the blue light emitting layer is made of a blue light emitting material that emits blue light. The red light emitting layer, the green light emitting layer, and the blue light emitting layer are formed in an opening 31 of a bank 30.

The bank 30 separates a material liquid of the red light emitting layer, a material liquid of the green light emitting layer, and a material liquid of the blue light emitting layer from each other, thereby preventing the material liquids from being mixed together. The bank 30 has insulation properties and fills a contact hole that penetrates the flattening layer 18.

<Method of Manufacturing Organic Light Emitting Diode>

Figure 3:
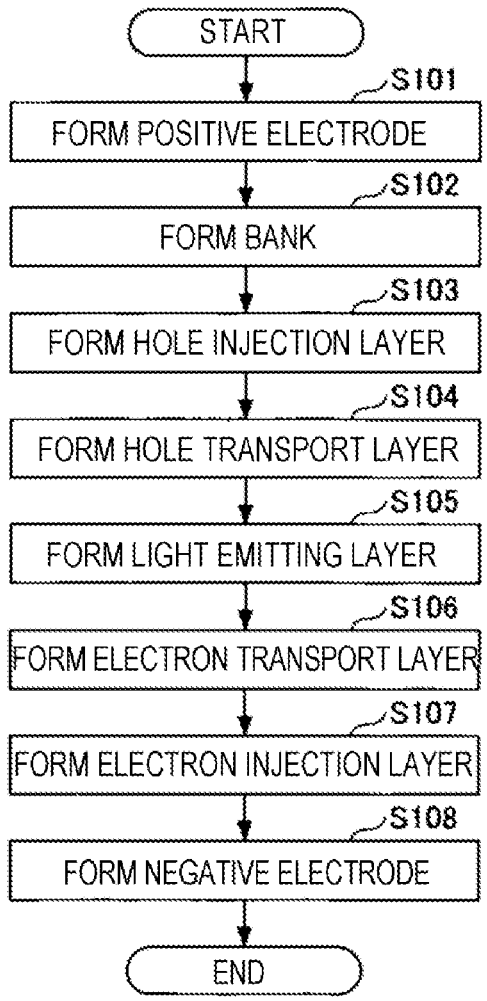
FIG. 3 is a flowchart illustrating a method of manufacturing an organic light emitting diode according to the exemplary embodiment.

FIG. 3 is a flowchart illustrating a method of manufacturing the organic light emitting diode according to the exemplary embodiment.

First, in step S101, the positive electrode 21 is formed as a pixel electrode. For example, a vapor deposition method is used to form the positive electrode 21. The positive electrode 21 is formed for each unit circuit 11 on the flat surface of the flattening layer 18. The contact plug 19 may be formed together with the positive electrode 21.

In the subsequent step S102, the bank 30 is formed. The bank 30 is formed using, for example, photoresist, and patterned in a predetermined pattern by a photolithography process. The positive electrode 21 is exposed through the opening 31 of the bank 30.

Figure 4:
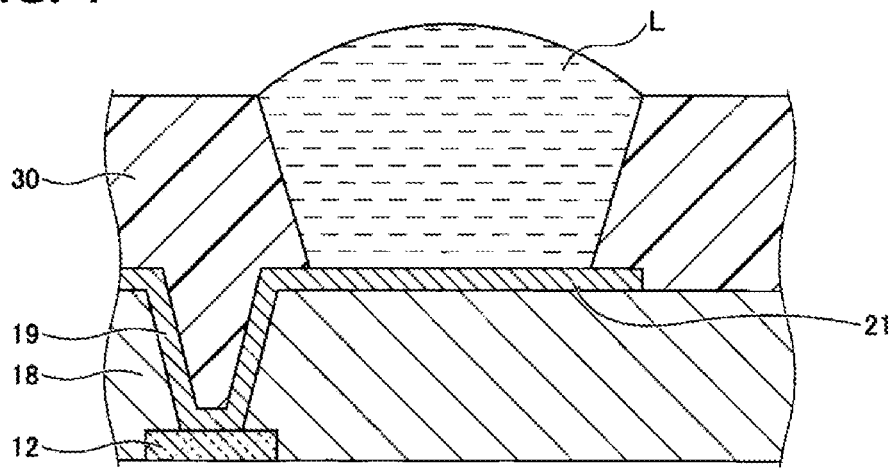
FIG. 4 is a cross-sectional view illustrating a substrate on which a coated layer according to the exemplary embodiment is formed.
Figure 5:
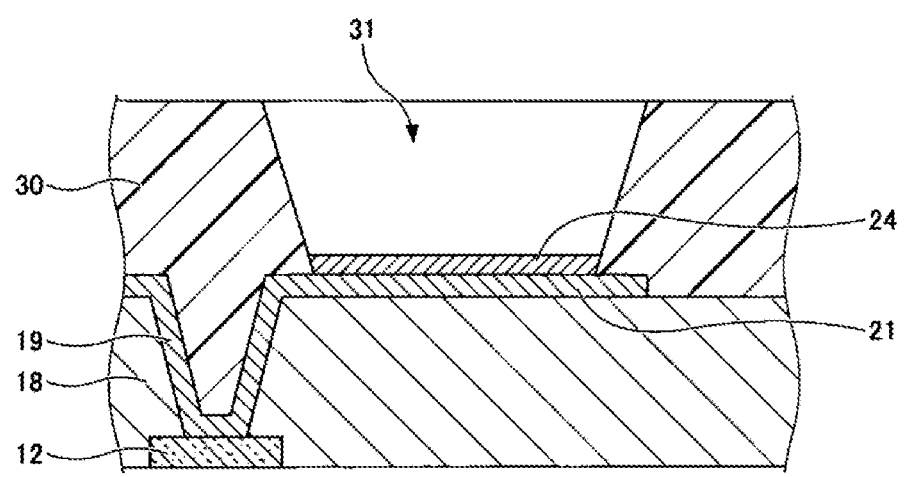
FIG. 5 is a cross-sectional view illustrating the substrate in which the coated layer illustrated in FIG. 4 is dried under reduced pressure.

In the subsequent step S103, the hole injection layer 24 is formed. The hole injection layer 24 is formed using an inkjet method or the like. As illustrated in FIG. 4, a coated layer L is formed by coating the positive electrode 21 with a material liquid of the hole injection layer 24 by the inkjet method. As illustrated in FIG. 5, the hole injection layer 24 is formed by drying and baking the coated layer L.

In the subsequent step S104, the hole transport layer 25 is formed. Similar to the process of forming the hole injection layer 24, the inkjet method or the like is used to form the hole transport layer 25. A coated layer is formed by coating the hole injection layer 24 with a material liquid of the hole transport layer 25 by the inkjet method. The hole transport layer 25 is formed by drying and baking the coated layer.

In the subsequent step S105, the light emitting layer 26 is formed. Similar to the process of forming the hole injection layer 24 or the hole transport layer 25, the inkjet method or the like is used to form the light emitting layer 26. A coated layer is formed by coating the hole transport layer 25 with a material liquid of the light emitting layer 26 by the inkjet method. The light emitting layer 26 is formed by drying and baking the coated layer.

For example, the red light emitting layer, the green light emitting layer, and the blue light emitting layer are formed as the light emitting layer 26. The red light emitting layer, the green light emitting layer, and the blue light emitting layer are formed in the opening 31 of the bank 30. The bank 30 separates the material liquid of the red light emitting layer, the material liquid of the green light emitting layer, and the material liquid of the blue light emitting layer from each other, thereby preventing the functional liquids from being mixed together.

In the subsequent step S106, the electron transport layer 27 is formed. For example, a vapor deposition method or the like is used to form the electron transport layer 27. Since the electron transport layer 27 may be provided in common for the multiple unit circuits 11, the electron transport layer 27 may be formed not only on the light emitting layer 26 in the opening 31 of the bank 30, but also on the bank 30.

In the subsequent step S107, the electron injection layer 28 is formed. For example, a vapor deposition method or the like is used to form the electron injection layer 28. The electron injection layer 28 is formed on the electron transport layer 27. The electron injection layer 28 may be provided in common for the multiple unit circuits 11.

In subsequent step S108, the negative electrode 22 is formed. For example, a vapor deposition method or the like is used to form the negative electrode 22. The negative electrode 22 is formed on the electron injection layer 28. The negative electrode 22 may be provided in common for the multiple unit circuits 11.

In a case in which a method of operating the organic EL display is not an active matrix method but a passive matrix method, the negative electrode 22 is patterned in a predetermined pattern.

With the aforementioned process, the organic light emitting diode 13 is manufactured. A substrate processing system 100 is used to form the hole injection layer 24, the hole transport layer 25, and the light emitting layer 26 among the organic layers 23.

<Substrate Processing System>

Figure 6:
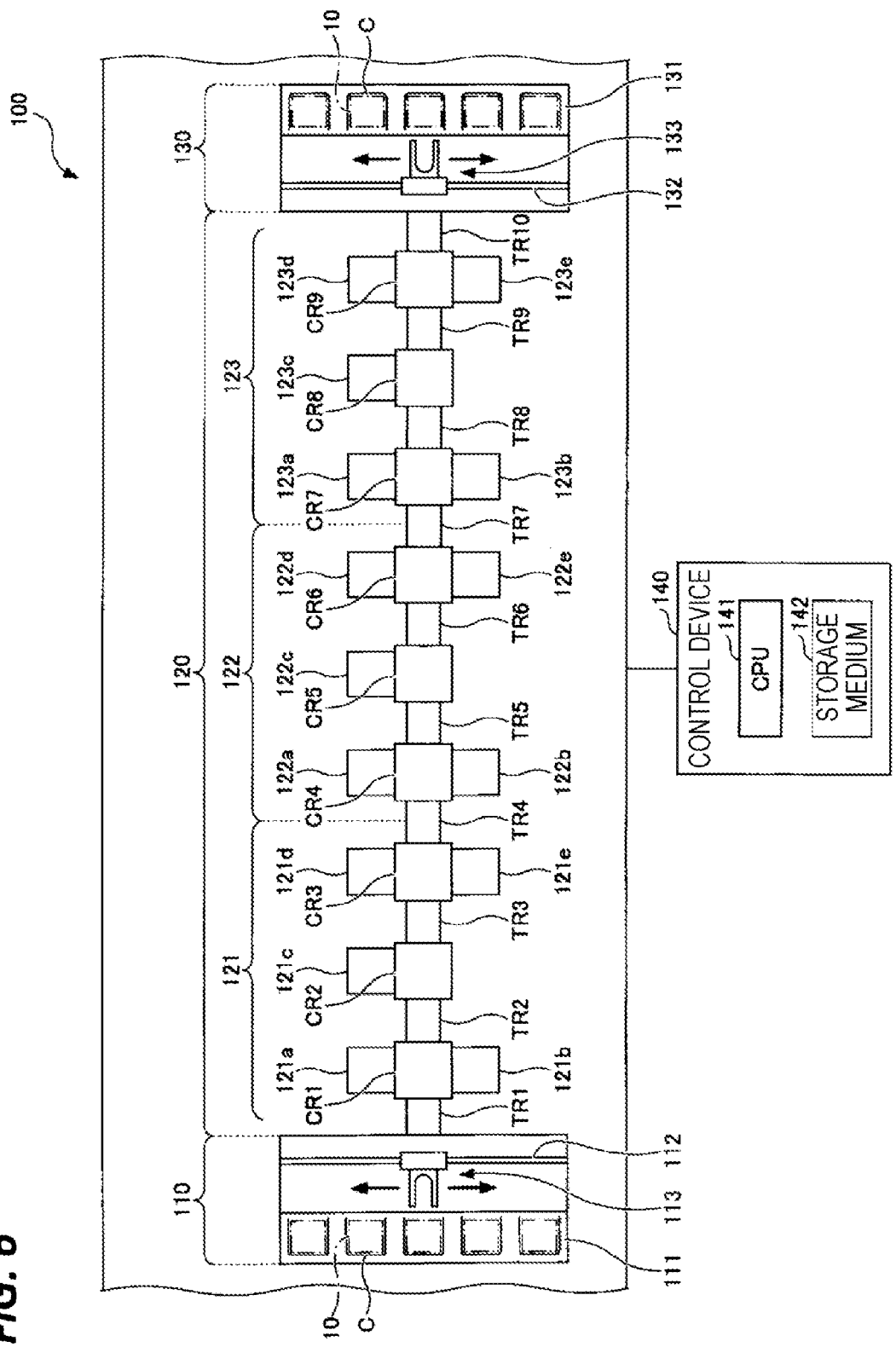
FIG. 6 is a top plan view illustrating a substrate processing system according to the exemplary embodiment.

FIG. 6 is a top plan view illustrating the substrate processing system according to the exemplary embodiment. The substrate processing system 100 performs the respective processes corresponding to steps S103 to S105 illustrated in FIG. 3, and forms the hole injection layer 24, the hole transport layer 25, and the light emitting layer 26 on the positive electrode 21. The substrate processing system 100 has a loading station 110, a process station 120, an unloading station 130, and a control device 140.

The loading station 110 loads a cassette C which accommodates multiple substrates 10 from the outside, and sequentially extracts the multiple substrates 10 from the cassette C. The TFT layer 12, the flattening layer 18, the positive electrode 21, the bank 30, and the like are formed in advance on each of the substrates 10.

The loading station 110 includes a cassette placement table 111 on which the cassette C is placed, a transport path 112 which is provided between the cassette placement table 111 and the process station 120, and a substrate transport body 113 which is provided in the transport path 112. The substrate transport body 113 transports the substrate 10 between the process station 120 and the cassette C placed on the cassette placement table 111.

The process station 120 forms the hole injection layer 24, the hole transport layer 25, and the light emitting layer 26 on the positive electrode 21. The process station 120 includes a hole injection layer forming block 121 which forms the hole injection layer 24, a hole transport layer forming block 122 which forms the hole transport layer 25, and a light emitting layer forming block 123 which forms the light emitting layer 26.

The hole injection layer forming block 121 forms the hole injection layer 24 by forming a coated layer by coating the positive electrode 21 with the material liquid of the hole injection layer 24, and drying and baking the coated layer. The material liquid of the hole injection layer 24 includes an organic material and a solvent. The organic material may be any one of a polymer and a monomer. The polymer may be made by baking and polymerizing the monomers.

The hole injection layer forming block 121 includes a coating apparatus 121a, a buffer device 121b, a reduced pressure drying device 121c, a heat treatment device 121d, and a temperature adjusting device 121e. The coating apparatus 121a discharges droplets of the material liquid of the hole injection layer 24 toward the opening 31 of the bank 30. The buffer device 121b temporarily accommodates the substrate 10 that waits for the process. The reduced pressure drying device 121c dries, under reduced pressure, the coated layer applied by the coating apparatus 121a, thereby removing the solvent contained in the coated layer. The heat treatment device 121d performs a heat treatment on the coated layer dried by the reduced pressure drying device 121c. The temperature adjusting device 121e adjusts a temperature of the substrate 10, which is thermally treated by the heat treatment device 121d, to a predetermined temperature, for example, to a room temperature.

An air atmosphere is maintained in the coating apparatus 121a, the buffer device 121b, the heat treatment device 121d, and the temperature adjusting device 121e. The reduced pressure drying device 121c changes the atmosphere therein to the air atmosphere and a reduced pressure atmosphere.

In the hole injection layer forming block 121, the arrangement, the number, and the internal atmosphere of the coating apparatus 121a, the buffer device 121b, the reduced pressure drying device 121c, the heat treatment device 121d, and the temperature adjusting device 121e may be arbitrarily selected.

The hole injection layer forming block 121 includes substrate transport devices CR1 to CR3 and delivery devices TR1 and TR3. The substrate transport devices CR1 to CR3 transport the substrate 10 to the respective adjacent devices. For example, the substrate transport device CR1 transports the substrate 10 to the coating apparatus 121a and the buffer device 121b adjacent to the substrate transport device CR1. The substrate transport device CR2 transports the substrate 10 to the reduced pressure drying device 121c adjacent to the substrate transport device CR2. The substrate transport device CR3 transports the substrate 10 to the heat treatment device 121d and the temperature adjusting device 121e adjacent to the substrate transport device CR3. The delivery devices TR1 to TR3 are sequentially provided between the loading station 110 and the substrate transport device CR1, between the substrate transport device CR1 and the substrate transport device CR2, and between the substrate transport device CR2 and the substrate transport device CR3, and deliver the substrate 10 between the loading station 110 and the substrate transport device CR1, between the substrate transport device CR1 and the substrate transport device CR2, and between the substrate transport device CR2 and the substrate transport device CR3. The inside of each of the substrate transport devices CR1 to CR3 and the delivery devices TR1 to TR3 is maintained in an air atmosphere.

A delivery device TR4, which delivers the substrate 10 between the substrate transport device CR3 of the hole injection layer forming block 121 and a substrate transport device CR4 of the hole transport layer forming block 122, is provided between the substrate transport device CR3 of the hole injection layer forming block 121 and the substrate transport device CR4 of the hole transport layer forming block 122. The air atmosphere is maintained in the delivery device TR4.

The hole transport layer forming block 122 forms the hole transport layer 25 by forming a coated layer by coating the hole injection layer 24 with the material liquid of the hole transport layer 25, and drying and baking the coated layer. The material liquid of the hole transport layer 25 includes an organic material and a solvent. The organic material may be any one of a polymer and a monomer. The polymer may be made by baking and polymerizing the monomers.

The hole transport layer forming block 122 is provided with a coating apparatus 122a, a buffer device 122b, a reduced pressure drying device 122c, a heat treatment device 122d, and a temperature adjusting device 122e. The coating apparatus 122a discharges droplets of the material liquid of the hole transport layer 25 toward the opening 31 of the bank 30. The buffer device 122b temporarily accommodates the substrate 10 that waits for the process. The reduced pressure drying device 122c dries, under reduced pressure, the coated layer applied by the coating apparatus 122a, thereby removing the solvent contained in the coated layer. The heat treatment device 122d thermally treats the coated layer dried by the reduced pressure drying device 122c. The temperature adjusting device 122e adjusts a temperature of the substrate 10, which is thermally treated by the heat treatment device 122d, to a predetermined temperature, for example, to a room temperature.

The air atmosphere is maintained in the coating apparatus 122a and the buffer device 122b. Meanwhile, a low-oxygen and low-dew-point atmosphere is maintained in the heat treatment device 122d and the temperature adjusting device 122e in order to inhibit the organic material of the hole transport layer 25 from deteriorating. The reduced pressure drying device 122c changes the atmosphere therein to the low-oxygen and low-dew-point atmosphere and the reduced pressure atmosphere.

Here, the low-oxygen atmosphere refers to an atmosphere in which oxygen concentration is lower than oxygen concentration in the atmosphere, for example, an atmosphere in which oxygen concentration is 10 ppm or less. In addition, the low-dew-point atmosphere refers to an atmosphere in which a dew point temperature is lower than a dew point temperature in the atmosphere, for example, an atmosphere in which a dew point temperature is −10° C. or lower. For example, the low-oxygen and low-dew-point atmosphere is formed by inert gas such as nitrogen gas.

In the hole transport layer forming block 122, the arrangement, the number, and the internal atmosphere of the coating apparatus 122a, the buffer device 122b, the reduced pressure drying device 122c, the heat treatment device 122d, and the temperature adjusting device 122e may be arbitrarily selected.

The hole transport layer forming block 122 includes substrate transport devices CR4 to CR6 and delivery devices TR5 and TR6. The substrate transport devices CR4 to CR6 transport the substrate 10 to the respective adjacent devices. The delivery devices TR5 and TR6 are sequentially provided between the substrate transport device CR4 and the substrate transport device CR5 and between the substrate transport device CR5 and the substrate transport device CR6, and deliver the substrate 10 between the substrate transport device CR4 and the substrate transport device CR5 and between the substrate transport device CR5 and the substrate transport device CR6.

The air atmosphere is maintained in the substrate transport device CR4. Meanwhile, the low-oxygen and low-dew-point atmosphere is maintained in the substrate transport devices CR5 and CR6. The reason is that the atmosphere in the reduced pressure drying device 122c adjacent to the substrate transport device CR5 is changed to the low-oxygen and low-dew-point atmosphere and the reduced pressure atmosphere. In addition, the reason is that the low-oxygen and low-dew-point atmosphere is maintained in the heat treatment device 122d and the temperature adjusting device 122e provided adjacent to the substrate transport device CR6.

The delivery device TR5 is configured as a load locking device which changes the atmosphere therein to the air atmosphere and the low-oxygen and low-dew-point atmosphere. The reason is that the reduced pressure drying device 122c is provided adjacent to a downstream side of the delivery device TR6. Meanwhile, the low-oxygen and low-dew-point atmosphere is maintained in the delivery device TR6.

A delivery device TR7, which delivers the substrate 10 between the substrate transport device CR6 of the hole transport layer forming block 122 and a substrate transport device CR7 of the light emitting layer forming block 123, is provided between the substrate transport device CR6 of the hole transport layer forming block 122 and the substrate transport device CR7 of the light emitting layer forming block 123. The low-oxygen and low-dew-point atmosphere is maintained in the substrate transport device CR6, and the air atmosphere is maintained in the substrate transport device CR7. For this reason, the delivery device TR7 is configured as a load locking device which changes an atmosphere therein to the low-oxygen and low-dew-point atmosphere and the air atmosphere.

The light emitting layer forming block 123 forms the light emitting layer 26 by forming a coated layer by coating the hole transport layer 25 with the material liquid of the light emitting layer 26, and drying and baking the formed coated layer. The material liquid of the light emitting layer 26 includes an organic material and a solvent. The organic material may be any one of a polymer and a monomer. The polymer may be made by baking and polymerizing the monomers.

The light emitting layer forming block 123 includes a coating apparatus 123a, a buffer device 123b, a reduced pressure drying device 123c, a heat treatment device 123d, and a temperature adjusting device 123e. The coating apparatus 123a discharges droplets of the material liquid of the light emitting layer 26 toward the opening 31 of the bank 30. The buffer device 123b temporarily accommodates the substrate 10 that waits for the process. The reduced pressure drying device 123c dries, under reduced pressure, the coated layer applied by the coating apparatus 123a, thereby removing the solvent contained in the coated layer. The heat treatment device 123d thermally treats the coated layer dried by the reduced pressure drying device 123c. The temperature adjusting device 123e adjusts a temperature of the substrate 10, which is thermally treated by the heat treatment device 123d, to a predetermined temperature, for example, to a room temperature.

The air atmosphere is maintained in the coating apparatus 123a and the buffer device 123b. Meanwhile, the low-oxygen and low-dew-point atmosphere is maintained in the heat treatment device 123d and the temperature adjusting device 123e in order to inhibit the organic material of the light emitting layer 26 from deteriorating. The reduced pressure drying device 123c changes the atmosphere therein to the low-oxygen and low-dew-point atmosphere and the reduced pressure atmosphere.

In the light emitting layer forming block 123, the arrangement, the number, and the internal atmosphere of the coating apparatus 123a, the buffer device 123b, the reduced pressure drying device 123c, the heat treatment device 123d, and the temperature adjusting device 123e may be arbitrarily selected.

The light emitting layer forming block 123 includes substrate transport devices CR7 to CR9 and delivery devices TR8 and TR9. The substrate transport devices CR7 to CR9 transport the substrate 10 to the respective adjacent devices. The delivery devices TR8 and TR9 are sequentially provided between the substrate transport device CR7 and the substrate transport device CR8 and between the substrate transport device CR8 and the substrate transport device CR9, and deliver the substrate 10 between the substrate transport device CR7 and the substrate transport device CR8 and between the substrate transport device CR8 and the substrate transport device CR9.

The air atmosphere is maintained in the substrate transport device CR7. Meanwhile, the low-oxygen and low-dew-point atmosphere is maintained in the substrate transport devices CR8 and CR9. The reason is that the atmosphere in the reduced pressure drying device 123c adjacent to the substrate transport device CR8 is changed to the low-oxygen and low-dew-point atmosphere and the reduced pressure atmosphere. In addition, the reason is that the low-oxygen and low-dew-point atmosphere is maintained in the heat treatment device 123d and the temperature adjusting device 123e provided adjacent to the substrate transport device CR9.

The delivery device TR8 is configured as a load locking device which changes the atmosphere therein to the air atmosphere and the low-oxygen and low-dew-point atmosphere. The reason is that the reduced pressure drying device 123c is provided adjacent to a downstream side of the delivery device TR8. The low-oxygen and low-dew-point atmosphere is maintained in the delivery device TR9.

A delivery device TR10, which delivers the substrate 10 between the substrate transport device CR9 of the light emitting layer forming block 123 and the unloading station 130, is provided between the substrate transport device CR9 of the light emitting layer forming block 123 and the unloading station 130. The low-oxygen and low-dew-point atmosphere is maintained in the substrate transport device CR9, and the air atmosphere is maintained in the unloading station 130. For this reason, the delivery device TR7 is configured as a load locking device which changes the atmosphere therein to the low-oxygen and low-dew-point atmosphere and the air atmosphere.

The unloading station 130 sequentially accommodates the multiple substrates 10 in the cassette C, and unloads the cassette C to the outside. The unloading station 130 is provided with a cassette placement table 131 on which the cassette C is placed, a transport path 132 which is provided between the cassette placement table 131 and the process station 120, and a substrate transport body 133 which is provided in the transport path 132. The substrate transport body 133 transports the substrate 10 between the process station 120 and the cassette C placed on the cassette placement table 131.

The control device 140 is configured as a computer including a central processing unit (CPU) 141 and a storage medium 142 such as a memory, and implements various types of processes by executing a program (called a recipe) stored in the storage medium 142 by using the CPU 141.

The program of the control device 140 is stored in an information storage medium and installed from the information storage medium. For example, a hard disk (HD), a flexible disk (FD), a compact disk (CD), a magneto-optical disk (MO), a memory card, and the like may be used as the information storage medium. In addition, the program may be installed by being downloaded from a server via the Internet.

Next, a method of processing a substrate using the substrate processing system 100 configured as described above will be described. When the cassette C, which accommodates the multiple substrates 10, is placed on the cassette placement table 111, the substrate transport body 113 sequentially extracts the substrate 10 from the cassette C placed on the cassette placement table 111, and transports the substrate 10 to the hole injection layer forming block 121.

The hole injection layer forming block 121 forms the hole injection layer 24 by forming a coated layer by coating the positive electrode 21 with the material liquid of the hole injection layer 24, and drying and baking the formed coated layer. The substrate 10 on which the hole injection layer 24 is formed is delivered by the delivery device TR4 from the hole injection layer forming block 121 to the hole transport layer forming block 122.

The hole transport layer forming block 122 forms the hole transport layer 25 by forming a coated layer by coating the hole injection layer 24 with the material liquid of the hole transport layer 25, and drying and baking the formed coated layer. The substrate 10 on which the hole transport layer 25 is formed is delivered by the delivery device TR7 from the hole transport layer forming block 122 to the light emitting layer forming block 123.

The light emitting layer forming block 123 forms the light emitting layer 26 by forming a coated layer by coating the hole transport layer 25 with the material liquid of the light emitting layer 26, and drying and baking the formed coated layer. The substrate 10 on which the light emitting layer 26 is formed is delivered by the delivery device TR10 from the light emitting layer forming block 123 to the unloading station 130.

The substrate transport body 133 of the unloading station 130 accommodates the substrate 10, which is received from the delivery device TR10, in the predetermined cassette C on the cassette placement table 131. Therefore, a series of processes of processing the substrate 10 using the substrate processing system 100 ends.

The substrates 10 are unloaded to the outside from the unloading station 130 in a state in which the substrates 10 are accommodated in the cassette C. The electron transport layer 27, the electron injection layer 28, the negative electrode 22, and the like are formed on the substrate 10 unloaded to the outside.

<Coating Apparatus and Coating Method>

Figure 7:
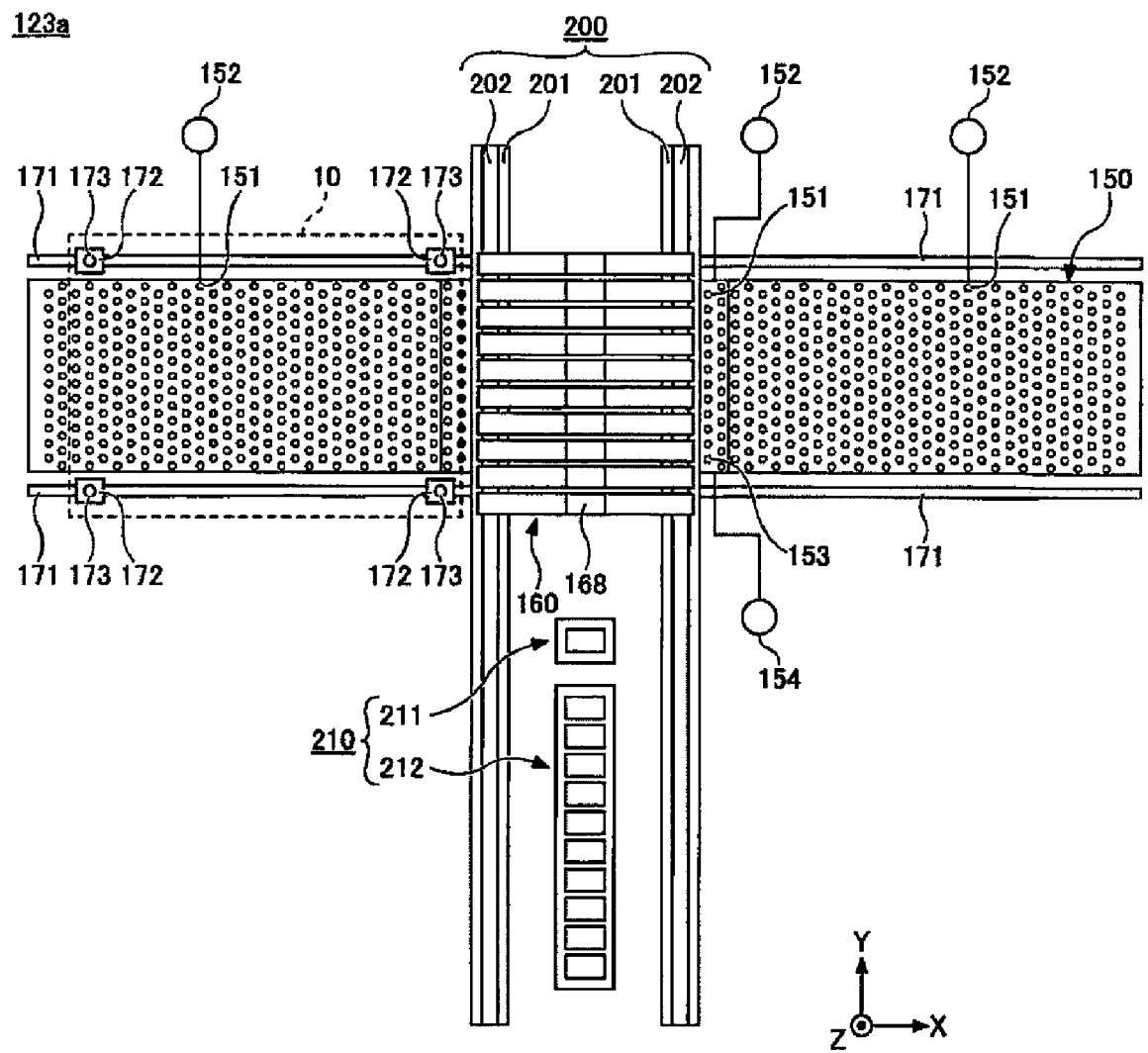
FIG. 7 is a top plan view illustrating a coating apparatus according to the exemplary embodiment.
Figure 8:
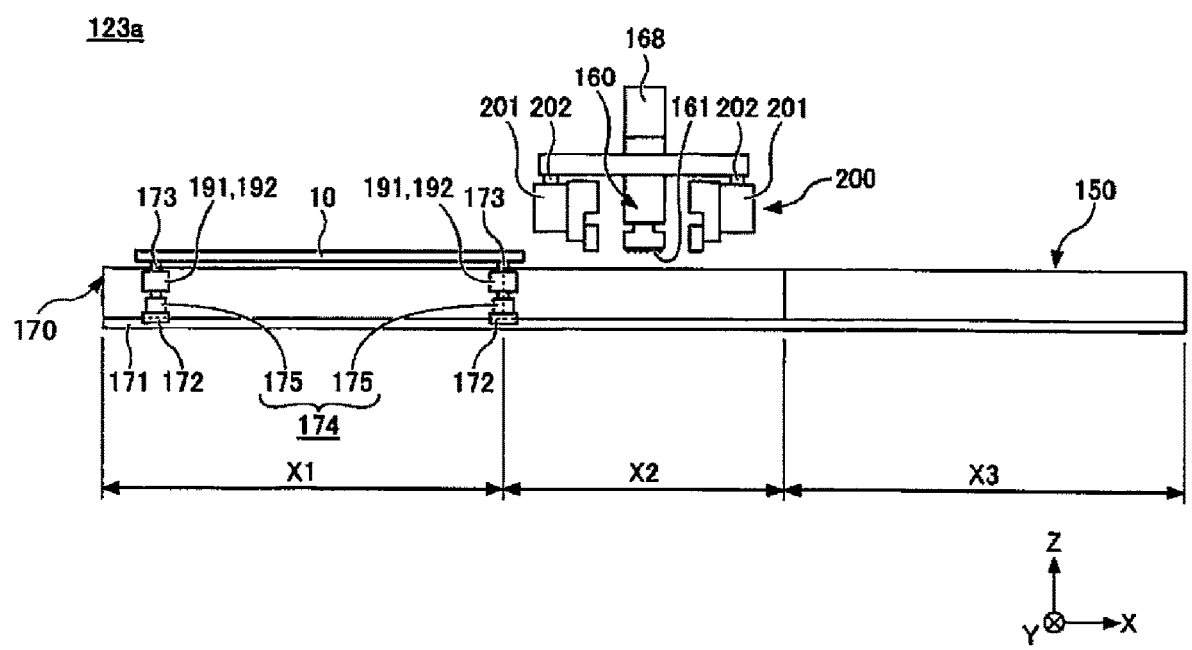
FIG. 8 is a side view illustrating the coating apparatus according to the exemplary embodiment.

Next, the coating apparatus 123a of the light emitting layer forming block 123 will be described with reference to FIGS. 7 and 8. FIG. 7 is a top plan view illustrating the coating apparatus according to the exemplary embodiment. In FIG. 7, a position at which the substrate 10 is loaded is indicated by a broken line. FIG. 8 is a side view illustrating the coating apparatus according to the exemplary embodiment. In the following drawings, an X direction is a main scanning direction, a Y direction is a sub-scanning direction, and a Z direction is a vertical direction. The X direction and the Y direction are horizontal directions orthogonal to each other. In addition, the X direction and the Y direction may intersect each other, and may not be orthogonal to each other.

The coating apparatus 123a draws a drawing pattern of the functional liquid on the substrate 10 by moving a landing position of the droplet of the functional liquid (e.g., the material liquid of the light emitting layer 26) on the substrate 10 in the X direction and the Y direction. The coating apparatus 123a includes, for example, a stage unit 150 which floats the substrate 10 to a predetermined height by using wind pressure of gas, and a droplet discharge unit 160 which drops the droplet of the functional liquid on the substrate 10 floated to the predetermined height from the stage unit 150. In addition, the coating apparatus 123a includes an X direction moving unit 170 which moves the substrate 10 in the X direction while holding the substrate 10 floated to the predetermined height from the stage unit 150, and a Y direction moving unit 200 which moves the droplet discharge unit 160 in the Y direction with respect to the substrate 10 floated to the predetermined height from the stage unit 150. In addition, the coating apparatus 123a includes a maintenance unit 210 which performs a process of maintaining the function of the droplet discharge unit 160.

The stage unit 150 has multiple gas supply ports 151 formed in an upper surface of the stage unit 150 to discharge gas. The stage unit 150 is connected to a gas supply source 152 which supplies gas to the respective gas supply ports 151. When the gas supply source 152 is operated, the gas is discharged from the respective gas supply ports 151 of the stage unit 150, such that the substrate 10 is supported by wind pressure of the gas at a constant height from the upper surface of the stage unit 150.

The stage unit 150 may have multiple suction ports 153 formed in the upper surface of the stage unit 150 to suction gas. The stage unit 150 is connected to a gas suction source 154 which suctions gas from the respective suction ports 153. When the gas suction source 154 is operated, gas is suctioned from the respective suction ports 153. Therefore, balance may be maintained between the suction amount of gas and the discharge amount of gas, and irregularity of a gap between the substrate 10 and the stage unit 150 may be reduced. As a result, it is possible to improve horizontality of an upper surface of the substrate 10.

As illustrated in FIG. 8, the stage unit 150 may be divided into three regions X1, X2, and X3 in the X direction, only the gas supply ports 151 may be provided in the regions X1 and X3 at both ends in the X direction, and both the gas supply ports 151 and the suction ports 153 may be provided in the region X2 at a center in the X direction. At an upper side of the region X2 at the center in the X direction, it is possible to improve horizontality of the substrate 10, and it is possible to improve precision of the drawing pattern of the functional liquid on the substrate 10. In addition, both the gas supply ports 151 and the suction ports 153 may also be provided in the regions X1 and X3 at both ends in the X direction.

The stage unit 150 may have lift pins (not illustrated) which are extended and retracted from the upper surface of the stage unit 150. The lift pins protrude from the upper surface of the stage unit 150 when the stage unit 150 delivers the substrate 10 between robots. Meanwhile, the lift pins are retracted from the upper surface of the stage unit 150 when the droplet discharge unit 160 drops the droplets of the functional liquid on the substrate 10 while the X direction moving unit 170 moves the substrate 10. For example, a pneumatic cylinder or the like is used as a lift mechanism for moving the lift pins upward and downward.

The droplet discharge unit 160 discharges the droplets of the functional liquid toward the substrate 10 floated to the predetermined height from the stage unit 150. The multiple droplet discharge units 160 (e.g., ten droplet discharge units 160 in FIG. 7) are arranged in the Y direction. The multiple droplet discharge units 160 may be independently moved in the Y direction or may be integrally moved in the Y direction.

Each of the droplet discharge units 160 has multiple discharge heads 161 (see FIG. 8). Each of the discharge heads 161 has a row of discharge nozzles configured by the multiple discharge nozzles arranged on a lower surface of the discharge head 161 in the Y direction. Each of the discharge heads 161 may have multiple rows of discharge nozzles on the lower surface of the discharge head 161.

Each of the discharge heads 161 has a piezo element provided for each discharge nozzle. When voltage is applied to the piezo element, the piezo element is transformed such that the droplet is discharged from the discharge nozzle. A heater or the like may be used instead of the piezo element. When voltage is applied to the heater, bubbles are produced, and a droplet is discharged from the discharge nozzle by pressure of the produced bubbles.

Each of the droplet discharge units 160 may discharge multiple types of functional liquids. Examples of the multiple types of functional liquids may include the material liquid of the red light emitting layer, the material liquid of the green light emitting layer, the material liquid of the blue light emitting layer, and the like. The multiple discharge nozzles, which are provided on the same discharge head 161, discharge droplets of the same type of functional liquid.

Figure 9:
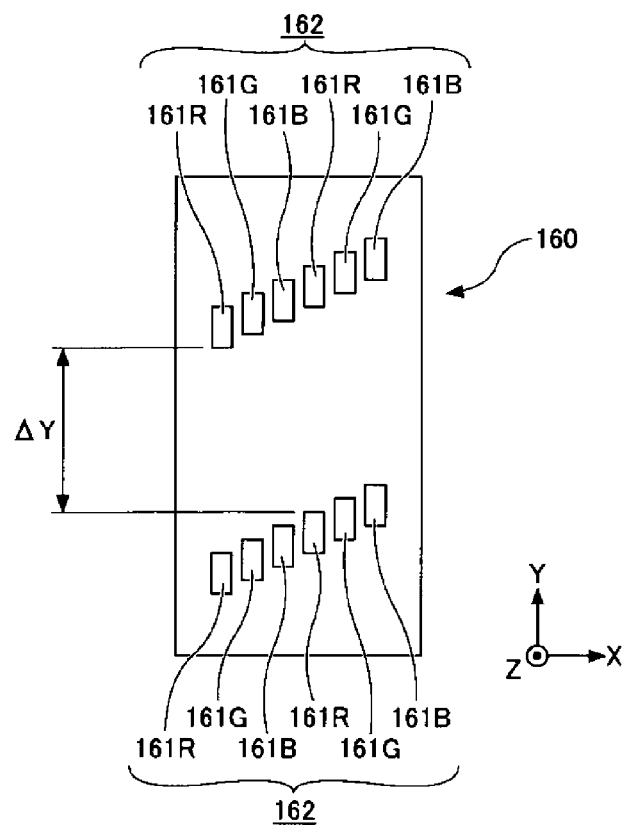
FIG. 9 is a top plan view illustrating an arrangement of discharge heads according to the exemplary embodiment.

FIG. 9 is a top plan view illustrating an arrangement of the discharge heads according to the exemplary embodiment. Each of the droplet discharge units 160 has two rows of discharge heads 162 arranged in the Y direction. Each of the rows of the discharge heads 162 includes six discharge heads 161 arranged in a step-like manner in the X direction. Each of the rows of the discharge heads 162 has two discharge heads 161R which discharge droplets of the material liquid of the red light emitting layer, two discharge heads 161G which discharge droplets of the material liquid of the green light emitting layer, and two discharge heads 161B which discharge droplets of the material liquid of the blue light emitting layer.

In the present exemplary embodiment, as described below in detail, the droplet discharge unit 160 is moved in the Y direction while drawing a drawing pattern of the functional liquid on the substrate 10. For this reason, as illustrated in FIG. 8, a vibration absorbing unit 168, which absorbs vibration of each of the droplet discharge units 160, may be mounted on each of the droplet discharge units 160. It is possible to improve precision of the drawing pattern of the functional liquid since vibration of each of the droplet discharge units 160 may be absorbed.

For example, a dynamic vibration absorber is used as the vibration absorbing unit 168. The dynamic vibration absorber has a mass body which vibrates while absorbing vibration of the droplet discharge unit 160. The mass body vibrates instead of the droplet discharge unit 160, thereby inhibiting vibration of the droplet discharge unit 160. The dynamic vibration absorber may include a damper which attenuates vibration of the mass body, and a spring which is provided between the mass body and the droplet discharge unit 160.

The Y direction moving unit 200 moves the droplet discharge unit 160 in the Y direction with respect to the substrate 10 floated to the predetermined height from the stage unit 150. The reason why the droplet discharge unit 160 is moved in the Y direction is that a gap ΔY is present between the multiple discharge heads 161 which discharge the same type of functional liquid, as illustrated in FIG. 9. It is possible to cause the droplets of the specific type of functional liquid to land on the entire substrate 10 in the Y direction by moving the droplet discharge unit 160 in the Y direction.

As illustrated in FIG. 7, the Y direction moving unit 200 has a pair of Y-axis beams 201 which traverses an upper side of the stage unit 150, a pair of Y-axis guides 202 which is placed on the pair of Y-axis beams 201, and a pair of Y-axis linear motors which moves the droplet discharge unit 160 along the pair of Y-axis guides 202.

The Y direction moving unit 200 moves the droplet discharge unit 160 between a position at which the droplet of the functional liquid is discharged to the substrate 10 floated to the predetermined height from the stage unit 150 and a position at which the process of maintaining the function by the maintenance unit 210 is received.

The maintenance unit 210 maintains the function of the droplet discharge unit 160, thereby solving a discharge defect of the droplet discharge unit 160. The maintenance unit 210 has a wiping unit 211 which sweeps a circumference of a discharge port of the discharge nozzle, and a suction unit 212 which suctions the droplets from the discharge port of the discharge nozzle. The suction unit 212 also serves to inhibit the discharge port of the discharge nozzle from being blocked when the discharge nozzle is in an inactive state, thereby inhibiting the discharge port from being clogged due to drying.

The X direction moving unit 170 moves the substrate 10, which is floated to the predetermined height from the stage unit 150, in the X direction, thereby allowing the substrate 10 to pass a lower side of the droplet discharge unit 160. The droplet discharge unit 160 discharges the droplets to the substrate 10 while the substrate 10 passes the lower side of the droplet discharge unit 160.

The X direction moving unit 170 has, for example, an X-axis guide unit 171 which extends in the X direction, and an X-axis slider unit 172 which is moved along the X-axis guide unit 171. A linear motor or the like is used as a driving source which moves the X-axis slider unit 172 along the X-axis guide unit 171.

The X direction moving unit 170 has, for example, a pair of X-axis guide units 171, and the pair of X-axis guide units 171 is provided with the stage unit 150 interposed therebetween in the Y direction. At least one (two in FIG. 7 and the like) X-axis slider unit 172 is provided so as to travel on each of the X-axis guide units 171.

The X direction moving unit 170 has multiple (e.g., four) substrate holding units 173 which hold the substrate 10. Each of the substrate holding units 173 holds the substrate 10 while moving together with the X-axis slider unit 172. For example, a vacuum suction pad is used as each of the substrate holding units 173, but an electrostatic suction pad and the like may be used.

As illustrated in FIG. 8, the X direction moving unit 170 may have a horizontality correction unit 174 which corrects horizontality of the substrate 10 held by the multiple substrate holding units 173. Therefore, for example, the upper surface of the bank 30 may be horizontally aligned, and as a result, it is possible to inhibit an overflow of the functional liquid from the opening 31 of the bank 30.

The horizontality correction unit 174 includes, for example, multiple lift units 175 which independently move the multiple substrate holding units 173 upward and downward. The lift unit 175 is provided for each of the substrate holding units 173. Each of the lift units 175 includes, for example, a servo motor, and a motion conversion mechanism such as a ball-screw which converts rotational motion of the servo motor into rectilinear motion.

The X direction moving unit 170 may have a yawing correction unit 190 (see FIG. 10) which rotates the substrate 10 held by the multiple substrate holding units 173 when viewed in the vertical direction. A rotation center of the substrate 10 may be set to a central portion of the substrate 10. The direction in which the opening 31 of the bank 30 is arranged and the direction in which the row of the discharge nozzles extends may be aligned by the yawing of the substrate 10.

Figure 10:
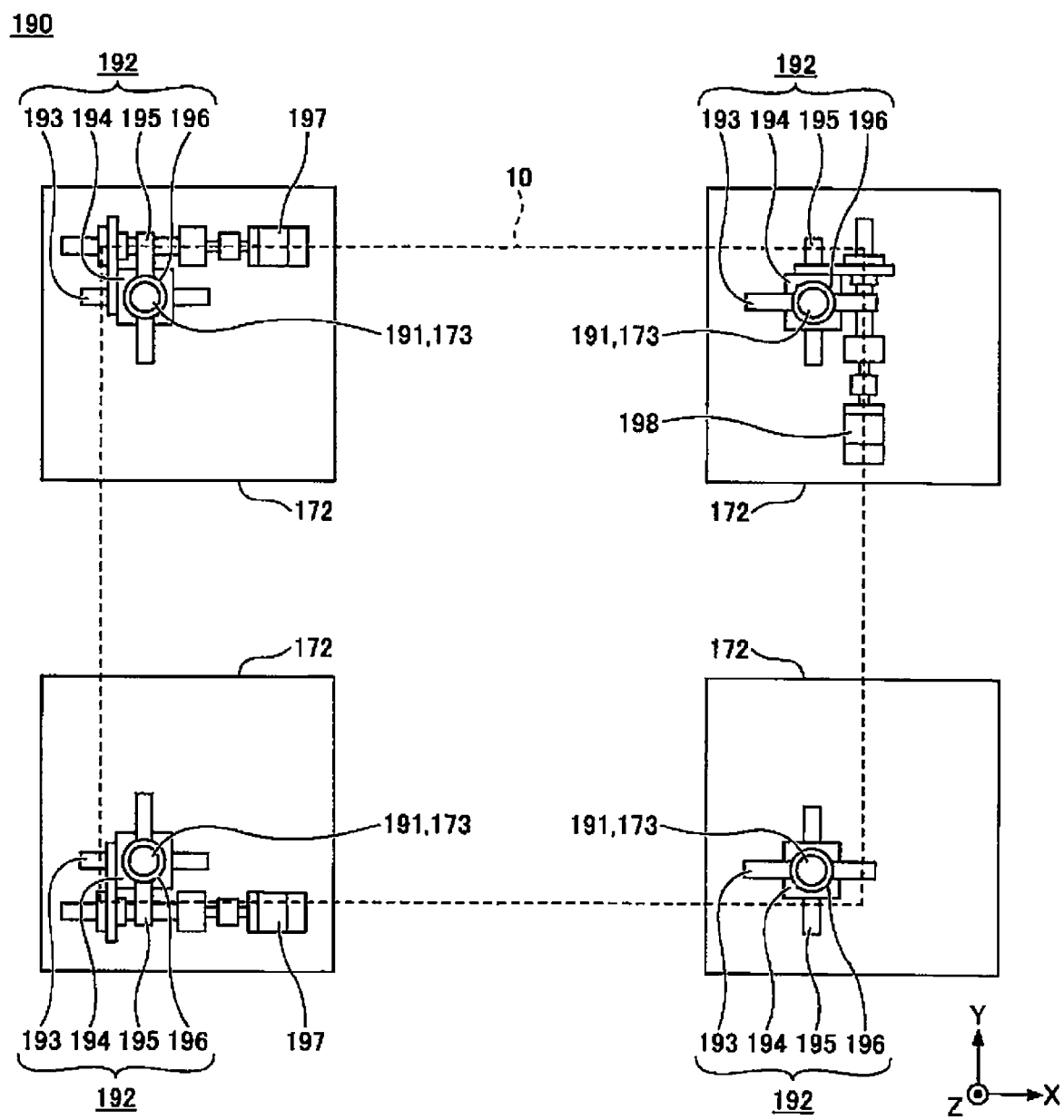
FIG. 10 is a top plan view illustrating a yawing correction unit of an X direction moving unit according to the exemplary embodiment.

FIG. 10 is a top plan view illustrating the yawing correction unit according to the exemplary embodiment. In FIG. 10, a position at which the substrate 10 is held is indicated by a broken line. In addition, FIG. 10 illustrates an enlarged view of the yawing correction unit 190.

The yawing correction unit 190 has, for example, multiple rotation support units 191 which allow the multiple substrate holding units 173 to independently rotate when viewed in the vertical direction, and multiple movement support units 192 which support the multiple substrate holding units 173 so that the multiple substrate holding units 173 may independently move in the X direction and the Y direction.

The rotation support unit 191 and the movement support unit 192 are provided for each of the substrate holding units 173. As illustrated in FIG. 8, the substrate holding unit 173 is mounted on the X-axis slider unit 172 by the rotation support unit 191, the movement support unit 192, or the lift unit 175.

The rotation support unit 191 is configured by a bearing which supports a rotating shaft that rotates together with the substrate holding unit 173, so that the rotating shaft is rotatable. The movement support unit 192 has an X-axis position correction guide 193 which extends in the X direction, an X-axis position correction slider 194 which is moved along the X-axis position correction guide 193, a Y-axis position correction guide 195 which extends in the Y direction, and a Y-axis position correction slider 196 which is moved along the Y-axis position correction guide 195.

For example, the rotation support unit 191 at the left side in FIG. 10 is fixed to the Y-axis position correction slider 196. The Y-axis position correction guide 195, which guides the Y-axis position correction slider 196 in the Y direction, is fixed to the X-axis position correction slider 194. The X-axis position correction guide 193, which guides the X-axis position correction slider 194 in the X direction, is mounted on the X-axis slider unit 172 by the lift unit 175.

The rotation support unit 191 at the right side in FIG. 10 is fixed to the X-axis position correction slider 194. The X-axis position correction guide 193, which guides the X-axis position correction slider 194 in the X direction, is fixed to the Y-axis position correction slider 196. The Y-axis position correction guide 195, which guides the Y-axis position correction slider 196 in the Y direction, is mounted on the X-axis slider unit 172 by the lift unit 175.

The yawing correction unit 190 has X-axis drive units 197 which move some substrate holding units 173 in the X direction, and Y-axis drive units 198 which move the other substrate holding units 173 in the Y direction. The X-axis drive unit 197 moves the X-axis position correction slider 194 along the X-axis position correction guide 193. The Y-axis drive unit 198 moves the Y-axis position correction slider 196 along the Y-axis position correction guide 195. The X-axis drive unit 197 and the Y-axis drive unit 198 are configured similar to the lift unit 175.

The yawing correction unit 190 rotates the substrate 10 held by the multiple substrate holding units 173 when viewed in the vertical direction by operating the X-axis drive unit 197 and the Y-axis drive unit 198. In addition, the yawing correction unit 190, which is configured as described above, may move the substrate 10, which is held by the multiple substrate holding units 173, horizontally in the X direction or horizontally in the Y direction.

The yawing correction unit 190 may have a brake device which prevents the movement of the X-axis position correction slider 194, the movement of the Y-axis position correction slider 196, and the rotation of the substrate holding unit 173 in order to prevent inadvertent yawing or the like of the substrate 10. The brake device permits the movement of the X-axis position correction slider 194, the movement of the Y-axis position correction slider 196, and the rotation of the substrate holding unit 173, as necessary.

Next, a coating method, which uses the coating apparatus 123*a* configured as described above, will be described. The following operation of the coating apparatus 123*a* is controlled by the control device 140. The control device 140 is provided separately from the coating apparatus 123*a* in FIG. 6, but the control device 140 may be provided as a part of the coating apparatus 123*a*.

First, when a robot (not illustrated) loads the substrate 10 into the coating apparatus 123*a* from the outside of the coating apparatus 123*a*, the stage unit 150 receives the substrate 10 from the robot by using the lift pins by allowing the lift pins to protrude from the upper surface of the stage unit 150. Thereafter, the stage unit 150 moves the lift pins downward, and floats the substrate 10 to the predetermined height from the upper surface of the stage unit 150 using wind pressure of gas discharged from the gas supply ports 151.

Subsequently, the X direction moving unit 170 allows the substrate 10 to perform yawing based on an image obtained by capturing an image of an alignment mark on the substrate 10 while holding the substrate 10 by using the multiple substrate holding units 173. In addition to the yawing of the substrate 10, the substrate 10 may be horizontally moved in the X direction or the Y direction, or horizontality of the substrate 10 may be corrected.

Thereafter, the X direction moving unit 170 moves the substrate 10, which is floated to the predetermined height from the stage unit 150, in the X direction, thereby allowing the substrate 10 to pass the lower side of the droplet discharge unit 160. The droplet discharge unit 160 discharges the droplets toward the substrate 10 while the substrate 10 passes the lower side of the droplet discharge unit 160.

Subsequently, the Y direction moving unit 200 moves the droplet discharge unit 160 in the Y direction with respect to the substrate 10 floated to the predetermined height from the stage unit 150. The reason why the droplet discharge unit 160 is moved in the Y direction is that the gap ΔY is present between the multiple discharge heads 161 which discharge the same type of functional liquid, as illustrated in FIG. 9. It is possible to cause the droplets of the specific type of functional liquid to land on the entire substrate 10 in the Y direction by moving the droplet discharge unit 160 in the Y direction.

Thereafter, the X direction moving unit 170 moves the substrate 10, which is floated to the predetermined height from the stage unit 150, in the X direction again, thereby allowing the substrate 10 to pass the lower side of the droplet discharge unit 160. The droplet discharge unit 160 discharges the droplets toward the substrate 10 while the substrate 10 passes the lower side of the droplet discharge unit 160.

As described above, the coating apparatus 123*a* alternately repeats the process of moving the substrate 10 in the X direction by the X direction moving unit 170 and dropping the droplets by the droplet discharge unit 160 and the process of moving the droplet discharge unit 160 in the Y direction by the Y direction moving unit 200, thereby drawing the drawing pattern of the functional liquid on the substrate 10.

After the drawing is terminated, the stage unit 150 lifts up the substrate 10 using the lift pins, and delivers the substrate 10 to the robot. Thereafter, the robot unloads the substrate 10 from the interior of the coating apparatus 123*a* to the outside from the coating apparatus 123*a*.

Thereafter, the robot loads the next substrate 10 into the coating apparatus 123*a* from the outside of the coating apparatus 123*a*, the coating apparatus 123*a* draws the drawing pattern of the functional liquid on the substrate 10, the robot unloads the substrate 10 from the interior of the coating apparatus 123*a* to the outside from the coating apparatus 123*a*, and these processes are repeated.

The process of maintaining the function of the droplet discharge unit 160 by the maintenance unit 210 is appropriately performed while the substrate 10 is replaced.

SUMMARY

As described above, according to the present exemplary embodiment, the coating apparatus 123*a* draws the drawing pattern of the functional liquid on the substrate 10 while floating the substrate 10 to the predetermined height from the stage unit 150 using wind pressure of gas, and as a result, it is possible to reduce driving power for moving the substrate 10. Therefore, it is possible to improve controllability related to a position of the substrate 10, and increase a movement speed of the substrate 10. To this end, the coating apparatus 123a includes the X direction moving unit 170 which moves the substrate 10, which is floated to the predetermined height from the stage unit 150 using wind pressure of gas, in the X direction, and the Y direction moving unit 200 which moves the droplet discharge unit 160 in the Y direction with respect to the substrate 10 floated to the predetermined height from the stage unit 150. The Y direction moving unit 200 moves the droplet discharge unit 160 in the Y direction while the X direction moving unit 170 continues to move the substrate 10 in the X direction and the droplet discharge unit 160 continues to drop the droplets. Therefore, the substrate 10 need not be shifted when the substrate 10 moves in the X direction and passes the lower side of the droplet discharge unit 160 or when a landing position of the droplet on the substrate 10 is adjusted in the Y direction, and as a result, it is possible to inhibit a positional deviation of the substrate 10 caused when the substrate 10 is shifted.

According to the present exemplary embodiment, the X direction moving unit 170 has the X-axis guide unit 171 which extends in the X direction, the X-axis slider unit 172 which is moved along the X-axis guide unit 171, and the multiple substrate holding units 173 which hold the substrate 10 while moving together with the X-axis slider unit 172. The movement of each of the substrate holding units 173 in the X direction may be stabilized by the X-axis guide unit 171, and as a result, it is possible to stabilize the movement of the substrate 10 in the X direction.

According to the present exemplary embodiment, the X direction moving unit 170 has the yawing correction unit 190 which rotates the substrate 10 floated to the predetermined height from the stage unit 150 when viewed in the vertical direction. Therefore, for example, it is possible to align the direction in which the opening 31 of the bank 30 is arranged and the direction in which the row of the discharge nozzles extends (i.e., the direction in which the discharge nozzles are arranged).

According to the present exemplary embodiment, the X direction moving unit 170 further has the horizontality correction unit 174 which corrects horizontality of the substrate 10 floated to the predetermined height from the stage unit 150. Therefore, for example, the upper surface of the bank 30 may be horizontally aligned, and as a result, it is possible to inhibit the overflow of the functional liquid from the opening 31 of the bank 30.

According to the present exemplary embodiment, the vibration absorbing unit 168, which absorbs vibration of the droplet discharge unit 160, is mounted on the droplet discharge unit 160. It is possible to absorb vibration generated when the droplet discharge unit 160 is moved in the Y direction while the drawing pattern of the functional liquid is drawn, and to inhibit oscillation of the functional liquid accommodated in the droplet discharge unit 160, and as a result, it is possible to improve precision of the drawing pattern of the functional liquid.

<Modification, Improvement>

While the exemplary embodiments of the coating apparatus and the like have been described above, the present disclosure is not limited to the exemplary embodiments, and may be variously modified and improved within the scope of the subject matter of the present disclosure disclosed in the claims.

For example, in the exemplary embodiment, the case in which the present disclosure is applied to the coating apparatus 123a of the light emitting layer forming block 123 has been described, but the present disclosure is not limited thereto. The coating apparatus of the present disclosure is not particularly limited as long as the coating apparatus of the present disclosure draws the drawing pattern of the functional liquid on the substrate. For example, the present disclosure may be applied to the coating apparatus 121a of the hole injection layer forming block 121 or the coating apparatus 122a of the hole transport layer forming block 122. In addition, the coating apparatus 122a of the hole transport layer forming block 122 may form multiple types of hole transport layers 25 corresponding to multiple types of light emitting layers 26. It is possible to improve compatibility of the light emitting layer 26 and the hole transport layer 25. Similarly, the coating apparatus 121a of the hole injection layer forming block 121 may form multiple types of hole injection layers 24 corresponding to multiple types of light emitting layers 26. It is possible to improve compatibility of the light emitting layer 26 and the hole injection layer 24.

In the exemplary embodiment, the three types of light emitting layers 26 including the red light emitting layer, the green light emitting layer, and the blue light emitting layer are provided, but the present disclosure is not limited thereto. For example, in addition to the three types of light emitting layers, it is possible to use a yellow light emitting layer which includes a yellow light emitting material that emits yellow light having the yellow color that is an intermediate color between the red color and the green color, and/or a light emitting layer which includes a cyan light emitting material that emits cyan light having the cyan color that is an intermediate color between the green color and the blue color. As the number of combined colors of emitted light is increased, a range of color coordinates, which may be displayed, is widened.

In the exemplary embodiment, the organic EL display uses a bottom emission method which extracts light from the light emitting layer 26 from the substrate 10, but may use a top emission method which extracts light from the light emitting layer 26 from a side opposite to the substrate 10.

In the case of the top emission method, the substrate 10 may not be a transparent substrate, but may be an opaque substrate. The reason is that the light from the light emitting layer 26 is extracted from the side opposite to the substrate 10.

In the case of the top emission method, the positive electrode 21, which is a transparent electrode, is used as a counter electrode, and the negative electrode 22 is used as a pixel electrode provided for each of the unit circuits 11. In this case, the positive electrode 21 and the negative electrode 22 are disposed in a reverse manner, and as a result, the electron injection layer 28, the electron transport layer 27, the light emitting layer 26, the hole transport layer 25, and the hole injection layer 24 are sequentially formed on the negative electrode 22.

In the exemplary embodiment, the organic layers 23 include the hole injection layer 24, the hole transport layer 25, the light emitting layer 26, the electron transport layer 27, and the electron injection layer 28 in this order in the direction from the positive electrode 21 to the negative electrode 22, but the organic layers 23 are not particularly limited as long as the organic layers 23 at least include the light emitting layer 26. The organic layer 23 is not limited to the configuration illustrated in FIG. 2.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A coating apparatus comprising:
a stationary stage which extends along a main scanning direction and has an upper surface covered by a plurality of gas supply ports which lifts a substrate to float at a predetermined height by using a pressurized gas;
a droplet discharger which includes a plurality of discharge heads and drops a droplet of a functional liquid on the substrate lifted to the predetermined height from the stationary stage;
a main scanning direction mover including a main scanning direction guide which extends in the main scanning direction, multiple main scanning direction sliders which are directly attached to and moved along the main scanning direction guide, and a substrate holder mounted on each of the multiple main scanning direction sliders and configured to hold the substrate; and
a sub-scanning direction mover which moves the droplet discharger in a sub-scanning direction with respect to the substrate lifted to the predetermined height from the stationary stage,
wherein the sub-scanning direction mover moves the droplet discharger in the sub-scanning direction while the main scanning direction mover continues to move the substrate in the main scanning direction and the droplet discharger continues to drop the droplet such that a drawing pattern of the functional liquid is formed on the substrate by moving a landing position of the droplet of the functional liquid on the substrate in the main scanning direction and the sub-scanning direction, and
wherein each substrate holder mounted on each of the multiple scanning direction sliders includes a rotation supporter having an x-axis position correction slider configured to move along an x-axis position correction guide and a y-axis position correction slider configured to move along a y-axis position correction guide, the rotation supporter configured to rotate the substrate held by each substrate holder when viewed from above.

2. The coating apparatus of claim 1, wherein the main scanning direction mover further has a lifter which corrects horizontality of the substrate held by each substrate holder.

3. The coating apparatus of claim 1, further comprising:
a vibration absorber which is mounted on the droplet discharger and absorbs vibration of the droplet discharger.

4. The coating apparatus of claim 1, wherein the stationary stage further includes a plurality of suction ports formed on the upper surface of the stationary stage.

5. The coating apparatus of claim 1, wherein the main scanning direction mover has a lifter configured to independently move each substrate holder upward and downward.

6. The coating apparatus of claim 1, wherein the main scanning direction guide extends along the stationary stage and is positioned along a side of the stationary stage in the main scanning direction when viewed from above.

7. The coating apparatus of claim 1, wherein the main scanning direction guide is a first main scanning direction guide and a second main scanning direction guide which extend along the stationary stage and are positioned on either side of the stationary stage in the main scanning direction when viewed from above.

8. The coating apparatus of claim 1, wherein the x-axis position correction slider and the y-axis position correction slider are both configured to move independently of the main scanning direction sliders.

* * * * *